United States Patent [19]
Kato et al.

[11] 4,438,154
[45] Mar. 20, 1984

[54] METHOD OF FABRICATING AN AMORPHOUS SILICON FILM

[75] Inventors: Kazuhisa Kato, Atsugi; Masaru Yasui, Yokohama, both of Japan

[73] Assignee: Stanley Electric Co., Ltd., Tokyo, Japan

[21] Appl. No.: 372,826

[22] Filed: Apr. 28, 1982

[51] Int. Cl.³ .............................................. C23C 11/00
[52] U.S. Cl. .......................................... 427/39; 427/74
[58] Field of Search .................................... 427/39, 74

[56] References Cited

U.S. PATENT DOCUMENTS 4,363,828  12/1982  Brodsky et al. ................... 427/39
4,369,205  1/1983  Winterling et al. ............... 427/39

*Primary Examiner*—James R. Hoffman
*Attorney, Agent, or Firm*—Cushman, Darby & Cushman

[57] ABSTRACT

In the method of forming an amorphous silicon film on a substrate supported on an electrode facing a discharging electrode within an evacuated reaction chamber through decomposition of a reacting gas introduced therein and containing at least silicon hydride such as $SiH_4$ along with or without a doping impurity gas, by glow discharging developed across the facing electrodes through application of a high frequency (radio frequency) electric power the oppose across, the improvement wherein: the power density of the electric power applied for glow discharging is so set that the ratio of the electric power relative to the discharging surface area of the discharging electrode is 0.3 W/cm² or greater, and the ratio F/V of the total flow rate F (l/min.) relative to the volume V (l) of the reaction chamber is 0.01 min.⁻¹ or greater. The resulting a-Si film has a high resistivity in darkness and a large photosensitivity which are suitable for electrophotography.

6 Claims, 2 Drawing Figures

METHOD OF FABRICATING AN AMORPHOUS SILICON FILM

BACKGROUND OF THE INVENTION (a) Field of the Invention

The present invention concerns a method of fabricating an amorphous silicon film which is employed in electrophotography to serve as a photoreceptor in copying machines, and more particularly it pertains to a method of fabricating an amorphous silicon film having a high-resistivity characteristic in dark conditions.

(b) Description of the Prior Art

Amorphous silicon (hereinafter to be referred to briefly as a-Si) has, of late, been attracting the interest of those who are in the technical fields of semiconductor devices as having a great potential to provide a semiconductor material employed in obtaining, at low cost, semiconductor devices having a large working area, because of the advantages such that the semiconducting, insulating and photoconducting characteristics of the a-Si film can be controlled at will by designing its production method and by controlling the conditions with which an impurity is doped therein. Also, in view of the fact that the solid condition of the a-Si film is amorphous, there is no need to go so far as to consider lattic regularity or lattic mismatch relative to a semiconductor substrate as has been required to take into consideration when a single crystal is used.

Especially in recent years, researches have been being made for the employment of a-Si films to serve as photoreceptors for electrophotography copying machines in view of the reasons that a-Si, as compared with such substances as amorphous selenium and Cds, has a greater hardness and is superior in its heat-resistant and chemically resistant properties.

Among those various characteristics which are required of those semiconductor materials which are employed to form a photoreceptor for electrophotography, there are two which are especially important. One is the highly resistive characteristic when the material is placed in dark conditions, and the other is represented by its photoconductive characteristic when it is placed in the conditions of being illuminated by light rays.

The greatest problem which has been encountered in placing a-Si films to practice is that it has been quite difficult to obtain said characteristic of being highly resistive in darkness.

According to the electrophotography which has been invented by C. F. Carlson, the initial step of copying a character or an image is to load, through corona discharge in darkness, an electric charge onto the surface of a semiconductor material serving as a photoreceptor, whereby the surface potential of the semiconductor material is elevated (which, however, is lowered in case of a negative corona discharge) through this charge-up. It is required that the holding of the charge will last for a lengthy period of time when placed in darkness. In other words, the attenuation of the surface potential is required to take a lengthy period of time. To this end, the semiconductor material employed is required to have as high a resistivity as being close to that of an insulator.

In order to use this a-Si film to serve as a photoreceptor, attempts have been made to form an a-Si film on a metal substrate such as aluminum, but there has not been obtained a satisfactorily high resistivity therefrom. Since an a-Si film is a structure-sensitive material, it should be understood that, in case an a-Si film is formed without any doping of an impurity, it often happens that the resulting film is of an n type with a low resistivity, which is considered to be due to various defects produced within the film. Even when a Group III impurity is doped at the time of forming a film for the purpose of compensating for n-type carriers, the resulting resistivity will be at the degree of only $10^{10}$–$10^{12}$ $\Omega$-cm at the highest. With such values of resistivity, the length of time of holding the charge is noted to be too short to be used for practical applications in copying machines of electrophotography. As a means of solving such a drawback of the prior art a-Si films, there has been proposed a method of doping, at the time an a-Si film is formed, an impurity or impurities such as $N_2$ and $O_2$, or $O_2$ and B, or $O_2$ plus B and P, or there has been proposed by the present inventors in their pending U.S. Ser. No. 342,650, a method of doping impurities $N_2$ and B, or $N_2$ plus B and P, to obtain an a-Si film having a high resistivity of a level above $10^{13}$ $\Omega$-cm.

However, in case such prior methods are carried out, the following problems arise. As discussed above, an a-Si film which serves as a photoreceptor requires, under the condition of being illuminated by light rays, to be superior in its photoconducting characteristic as a photoreceptor. In order to improve this photoconductivity, it should be understood that, since carriers are to be developed through illumination by light rays, the a-Si film which is produced is required to be able to use light rays of as great a wavelength as possible, i.e. the wavelength up to the absorption edge must be great, and the lifetime of the a-Si film is required to be long, and further the mobility of carriers is required to be large. In case a p type impurity gas as stated above or an $N_2$ or $O_2$ impurity gas is introduced, the a-Si film which is produced will be obtained as a highly resistive material when placed in darkness. However, there are formed, within the a-Si film, a number of energy levels due to such impurity or impurities as mentiond above, and carriers will be either trapped or scattered thereby, leading to a reduced mobility of carriers and to a shortened lifetime of the a-Si film, so that its photoconductivity will no longer become sensitive.

Even when a high resistive a-Si film is desired by relying on N atoms or O atoms as a result of the introduction of $N_2$ gas or $O_2$ gas at the time of production of the a-Si film, it should be noted that, in case the amount of such gas which is introduced is too small, no sufficiently high resistivity can be obtained, whereas in case the amount of the dose of such impurity gas or gases is or are too large, there can be obtained a high resistivity, but the photosensitivity of the a-Si film will drop remarkably. In an extreme case, the a-Si film can become so highly resistive as to be an insulator. Thus, controlling of the amount of the dosage of impurities has been very difficult to control in the prior art.

SUMMARY OF THE INVENTION

It is, therefore, the object of the present invention to provide a method of manufacturing an a-Si film which has a substantially higher photosensitivity as compared with such semiconductor materials as amorphous Se, CdS, ZnO or organic photoconductors which have been used to form a photoreceptor for use in electrophotography, and yet which has such sufficiently high resistivity as will exhibit a sufficiently long-standing holding of the loaded electric charge.

In each of the these drawings, there is shown the instance wherein electric power is supplied thereto by virtue of capacitive coupling between a discharge electrode and a high-frequency (i.e. radio frequency) power supply.

DETAILED DESCRIPTION OF THE PREFERRED EMBODIMENT

There have been considered various ways of forming an a-Si film on a substrate in the past. Of all these prior art methods, the most widely employed stable method is called the plasma CVD technique. This is a method of causing chemical deposition of gases through glow discharging. The present invention also relies on this technique.

Figure 1:
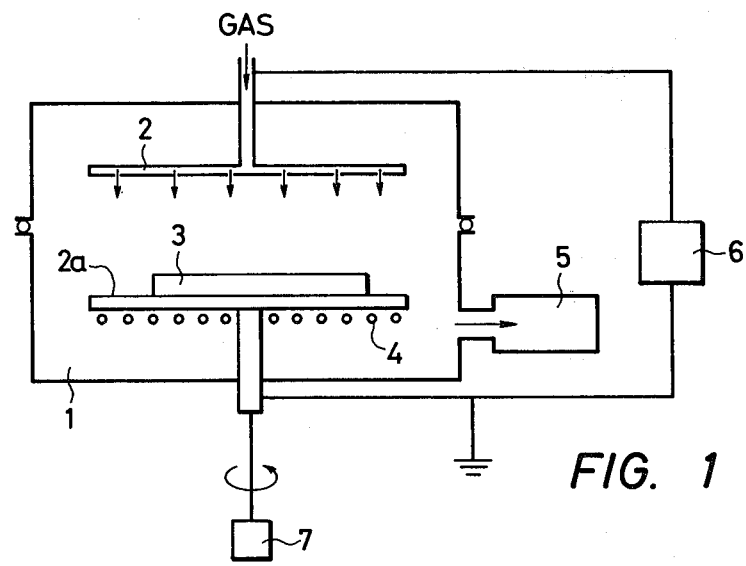
FIG. 1 is a schematic illustration of an apparatus for use in the formation of an amorphous silicon film on a planar substrate by relying on the known plasma CVD (Chemical Vapor Deposition) technique.

This plasma CVD technique will hereunder be described briefly by referring to FIG. 1. Within a reaction chamber 1 are placed opposing electrodes 2 and 2a and a substrate 3 which rests on one of these two electrodes. In the instance of FIG. 1, the substrate is a planar plate. A reacting gas such as $SiH_4$ is supplied into the reaction chamber 1 while being controlled of its supply rate, and this starting gas is allowed to flow thereinto uniformly through numerous perforations formed through the electrode 2 which mainly contributes to a glow discharge. The reaction chamber 1 is operatively connected to a vacuum pump 5. Under an appropriate pressure within the reaction chamber 1, electric power is supplied to the electrodes from a high frequency (radio frequency) power supply 6. It should be understood here that FIG. 1 as well as FIG. 2 which will be described later show the instance wherein power is supplied to the system by virtue of capacitive coupling, but that the power may be supplied by virtue of inductive coupling. Glow discharge is developed across the opposing electrodes 2 and 2a within the chamber 1. The reacting gas such as $SiH_4$ which has been introduced therein is decomposed by the energy of the glow discharge, and as a result, a-Si will deposit on the surface of the substrate 3. In order to make the property of the a-Si film deposited on the substrate 3 uniformly acceptable, the substrate 3 is heated up to a desired predetermined temperature by a heater 4 throughout the step of decomposition of the introduced gas through glow discharge, while the electrode 2a which supports the substrate 3 is being rotated by means of a motor 7.

Figure 2:
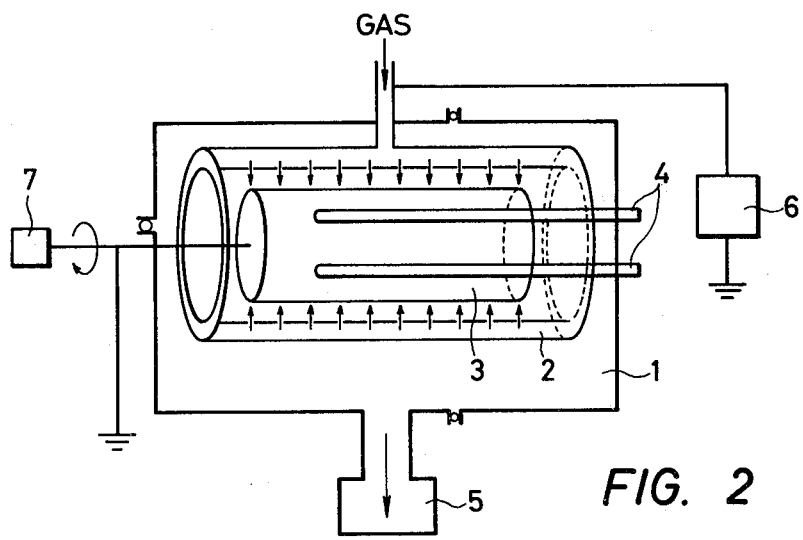
FIG. 2 is a schematic illustration of an apparatus for use in the formation of an amorphous silicon film on a cylindrical substrate by relying on the plasma CVD technique.

FIG. 2 illustrates diagrammatically an apparatus for use in carrying out a plasma CVD technique in exactly the same principle as that for FIG. 1. The only difference therebetween is noted in the shape of the substrate and the electrode. In FIG. 2, the substrate is a cylindrical metal substrate which is usually employed to serve as a substrate for the formation of a photoreceptor intended for a copying machine for electrophotography. It will be noted that the discharging electrode 2 by which the decomposition of the introduced gas takes place mainly through glow discharge has a cylindrical shape also, and the starting gas is supplied into the inside of this cylindrical shape. In this embodiment, the cylindrical substrate 3 per se serves concurrently as an electrode facing the abovesaid discharging electrode 2.

In the prior techniques, the density of the power which is supplied across the opposing electrodes for causing a glow discharge has been about 0.2 $W/cm^2$ or lower.

The term "power density" herein referred to means the value obtained by dividing the electric power which is supplied across the electrodes by the discharging area of the discharging electrode which faces the substrate and which mainly contributes to the development of glow discharge to cause decomposition of gas in case the coupling between the electrode and the power supply is capacitive when power is supplied from a radio frequency power supply. In case, however, the coupling is inductive, the power density means the value obtained by dividing the supplied electric power by the inner surface area of the cylindrical reaction chamber around which an RF coil is wound.

The reason for setting the power density to about 0.2 $W/cm^2$ for the formation of an a-Si film in the past is as follows. Conventionally, an a-Si film has been considered to be used as a material of a solar battery. Therefore, an importance has been placed on the photosensitivity of this film. When consideration is made centering around this photosensitivity, it is desired that an a-Si film which is produced by completely amorphous, though some H atoms will be contained within the amorphous silicon in case $SiH_4$ gas is decomposed. In case, however, it is intended that the a-Si film obtained is in perfect amorphous condition, the density of power which is applied is smaller the better. This is why an a-Si film has been formed at a considerably low power density of about 0.2 $W/cm^2$ or lower.

However, the present inventors have discovered the fact that, by the use of a power density above said value, the photosensitivity of the a-Si film which is produced exhibits some drop, but the high resistivity characteristic which is required for a photoreceptor in electrophotography can be obtained easily. This will be explained hereunder in further detail by showing the results of experiments conducted by the inventors.

When the density of the power of radio frequency is intensified progressively, the resistivity of the produced a-Si film increases accordingly. The result of experiments shows that, in case only $SiH_4$ gas is used, the resistivity of the film is noted to be about $10^8 \Omega$-cm when the RF power density is 0.16 $W/cm^2$, and it is $5 \times 10^{12} \Omega$-cm when the power density is 0.63 $W/cm^2$, and the resistivity is $10^{13} \Omega$-cm at the power density of 1.6 $W/cm^2$. The inventors have studied the reason why the resistivity of a-Si film shows such an increase as mentioned above.

Investigation has been conducted to note whether or not there would appear a diffraction pattern on an a-Si film produced at a power density of 0.3 $W/cm^2$ or lower, when the a-Si film is exposed to an X-ray. The result is that no particular diffraction pattern appears, and it is noted that this film is in an almost perfectly amorphous state. When the power density is increased up to a level over than 0.3 $W/cm^2$, there begins to appear an X-ray diffraction pattern with an intensity corresponding to Si (III). This indeed shows that fine single crystals or polycrystals begin to mingle within the a-Si film.

Also, the light ray absorption of the a-Si film has been studied by the use of an infrared spectrophotometer.

The result is that, at a power density of 0.3 W/cm² or lower, hardly any light ray absorption is noted, but that in case of an a-Si film produced at a power density above 0.3 W/cm², a clear development of absorption of light rays is observed at the wave number of 2100 cm⁻¹. This endorses the fact that an $SiH_2$ which begins absorption at the wave number of 2100 cm⁻¹ is present within the a-Si film.

From the foregoing findings, it may be considered that, when the power density is increased to a level above 0.3 W/cm², fine single silicon crystals or polycrystals begin to mingle in the a-Si film, and also that the bond condition of H atoms which are taken into the a-Si film varies, and as a result, in addition to the conventional Si-H compound type, the amount of the Si-$H_2$ type of compound increases, leading to an alteration of the characteristics of the a-Si film to begin to possess a high resistivity. From the foregoing findings, the technical term "amorphous" employed in the present invention not only points to a perfect amorphous condition, but it covers a larger sense of the word to include the condition containing the abovesaid crystals and/or compounds. And, an aspect of the present invention is in the acquisition of a highly resistive a-Si film by elevating the power density of glow discharge to a level above 0.3 W/cm² when an a-Si film is formed based on the findings obtained.

In the experiments conducted, some drop of photosensitivity of the a-Si film was noted when the power density was increased progressively. For example, the inventors manufactured a solar battery by the use of a p-i-n junction diode made with an a-Si film. At such instance, a p type a-Si layer was formed by an introduction of $B_2H_6$ gas into $SiH_4$ gas, and the thickness of the a-Si film was about 66 Å. An intrinsic a-Si film was formed by the use of $SiH_4$ gas alone, up to a thickness of 5000 Å. An n type a-Si layer was formed by adding $PH_3$ gas into $SiH_4$ gas, and the thickness was 200 Å. The efficiency of the resulting solar battery was determined on A.M. 1 (Air Mass 1), i.e. the solar energy at the ground surface, and the result was that the efficiency was noted to be about 3% when the film was formed at a power density of 0.16 W/cm², and it was about 0.9% at the power density of 0.63 W/cm².

Now, a study was made by the inventors with respect to those characteristics which are required of an a-Si film to serve as a photoreceptor in electrophotography, on an a-Si film which was produced to a thickness of 12 micrometers on the outer surface of a metallic cylindrical substrate made of aluminum of JIS (Japanese Industrial Standards) 3003 whose outer diameter was 120 mm and length was 300 mm, using a power density according to the present invention. The manufacturing conditions of the a-Si films was identical with those for the Example 1 which will be described later. The result of the study is shown in Table 1.

TABLE 1

| Initial surface potential by corona discharge in darkness | Attenuation of surface potential in darkness at end of 3 sec. | Attenuation of surface potential when illuminated at 450V to 225V | Residual value of surface potential |
|---|---|---|---|
| +450V | 225V | 0.2 lux · sec | 0 (V) |

As shown in Table 1, it has been confirmed that an a-Si film which is produced under such conditions as mentioned therein sufficiently possesses those fundamental properties for being used as a photoreceptor of electrophotography. Accordingly, as a simple confirming means, this photoreceptor drum is loaded on a commercially available copying machine, and copies are made in the usual copying procedures. The result is that clear copies are obtained. Thus, it has been found that this a-Si film can be used sufficiently as a photoreceptor material.

When a-Si films are produced at a power density lower than that employed in the present invention, i.e. at 0.3 W/cm² or lower, it has been found that the resulting a-Si films are not obtained as highly resistive films, and they are not able to hold electric charge at their surface, and thus such measurement cannot be performed.

As stated above, in order to attain the object of the present invention, it is, for one thing, necessary to set the power density for glow discharging to a level higher than 0.3 W/cm² at the time an a-Si film is formed. From the result of experiments, this power density desirably is 1.5 W/cm² or higher in order to obtain more stable a-Si films.

It should be understood, however, that an extremely high elevation of power density is not desirable because it will lead to an intensified glow discharge, so that the degree at which various portions within the reaction chamber are struck by reacting atoms will become intensive, causing various impurities to mingle into the a-Si film which is being produced. The adverse effect upon the a-Si film due to such contamination within the reaction chamber will be even greater when an impurity or impurities such as Boron and/or Phosphorous which control the conductivity type of the a-Si film is or are contained. As described above, the upper limit of the increase in the power density cannot be strictly defined because the reaction depends on the surrounding circumstances.

Now, the technique of setting the power density for glow discharging to a level above 0.3 W/cm² to obtain a highly resistive a-Si film serving as a photoreceptor in electrophotography is an essential requirement of the present invention. However, it should be noted that this technique alone is not sufficient to achieve the object of the present invention. This is because of the consideration that the rate or speed of formation of an a-Si film must be higher than a certain level from the practical point of view.

Description will hereunder be made with respect to the rate of formation of an a-Si film.

An a-Si film is used as a photoreceptor in electrophotography, and using commercially available toner, the copying operation is repeated over and over again on a copying machine. It has been found that the a-Si film requires a thickness of 10 micrometers or greater to serve as a photoreceptor.

As a matter of course, the speed of formation of an a-Si film also depends somewhat on the power density employed for causing a glow discharge. The rate of forming an a-Si film, in particular, greatly depends on the flow rate of such gas as $SiH_4$ which is introduced into the reaction chamber.

In case, for example, an a-Si film is formed by relying on the plasma CVD technique, it should be noted that, when the ratio F/V between the flow rate F (l/min.) of $SiH_4$ gas and the volume V (l) of the reaction chamber is set to 0.007 min.⁻¹ or higher by reducing the flow rate F of $SiH_4$ gas, the rate of formation of an a-Si film will become small, being about 0.8 μm/hr even when the power density for glow discharging is set at 0.5 W/cm² which is higher than that level which is claimed in the present invention to over than 0.3 W/cm². Accordingly, the length of time which is required for causing decomposition of gas through glow discharging in order to obtain an a-Si film having a thickness of 10 micrometers or greater will become ten and several hours or longer, which is not at all practical from the economical point of view. Furthermore, such a lengthy period of time required for the formation of an a-Si film is not desirable either because this is entailed by technical difficulties if various manufacturing conditions are to be controlled for an extended period of time to secure the uniformity of quality of the a-Si film which is to be produced. Such a lengthy period of time is again not desirable since there will arise an increase in the possibility of mingling of contaminants into the film from within the chamber. When, however, the flow rate of SiH₄ gas is increased and thus the abovesaid ratio F/V is increased to 0.04 min.$^{-1}$, then the rate of formation of the a-Si film at the same power density of 0.5 W/cm² becomes 5 μm/hr. This requires about 2 hours to obtain a thickness of the abovesaid about 10 micrometers or greater. This rate is sufficiently practical for the rate in the process of formation of an a-Si film. From the viewpoints that, for example, when such a-Si film is to be produced, the uniformity of quality of the film has to be maintained; that the possibility of contamination within the chamber has to be minimized; and also from practical points of view including economical aspect, it has been confirmed experimentally that the ratio F/V between the total flow rate F (l/min.) of gas which is introduced into the reaction chamber (in such case, the gas which is introduced therein may include such impurity gases as $B_2H_6$ and $PH_3$ in addition to $SiH_4$ gas) and the volume V (l) of the reaction chamber is 0.01 min.$^{-1}$ or greater. It such instance, the rate of forming an a-Si film becomes about 1 μm/hr to about 10 μm/hr. It is difficult, however, to definitely determine the upper limit of the abovesaid value of the ratio.

As will be understood from the foregoing explanation, the features of the present invention for the acquisition of an a-Si film for use as a photoreceptor in electrophotography reside in that the power density for causing a glow discharge is set at 0.3 W/cm² or higher, and that the abovesaid ratio F/V is set at 0.01 min.$^{-1}$ or greater. If an a-Si film is produced under such conditions as mentioned just above by the use of an apparatus as shown in FIG. 1 or FIG. 2, there can be obtained an a-Si film which is very superior in properties as a photoreceptor in electrophotography.

Hereunder will be shown some of the examples of conditions for manufacturing a-Si films, and their results. The frequency of the RF power supply employed in these examples is 13.56 MHz. It should be understood, however, that the magnitude of the frequency is not limited thereto.

EXAMPLE 1

A substrate made of aluminum whose size is 10 cm × 10 cm and whose thickness is 1 cm is placed in the apparatus shown in FIG. 1 equipped with a discharge electrode 2 (SUS 304) whose diameter is 20 cmφ (accordingly the discharging area of this electrode is 314 cm²). The volume of the reaction chamber is about 14 l. This apparatus is evacuated up to about $1 \times 10^{-3}$ Torr, and then a mixed gas consisting of 10% by volume of SiH₄ and 90% by volume of H₂ is introduced into the reaction chamber. The gas flow rate is 1000 ml/min. Accordingly, the abovesaid ratio F/V is about 0.07 min.$^{-1}$. By means of a rotary pump and a mechanical booster pump, the pressure within the reaction chamber is adjusted to about 10 Torr, and the temperature of the substrate is set 200° C. When the set value is gained, the system is connected to an RF power supply, to start a glow discharging. At such part of operation, the power which is supplied to the discharging electrode by virtue of travelling wave is set at 1 kW. At such time, the power loss which is invalid for glow discharging is about 10 W. Accordingly, the power density is about 3.2 W/cm². The substrate is rotated at a speed of 10 rpm. At the end of 2 hours, the system is turned off from the power supply, and supply of gas is suspended, and the reacting gas is evacuated from the chamber. After evacuation till the pressure within the chamber reaches about $1 \times 10^{-3}$ Torr, N₂ gas is introduced, and the resulting chamber is left at a pressure of about 1 Torr for 30 minutes. Then, the interior of the reaction chamber is returned back to the atmospheric pressure (760 Torr), and the aluminum plate on which a-Si has deposited is removed. The thickness of the film at such time is 16 micrometers. This a-Si film is held for 24 hours in darkness. Thereafter, the characteristics of this film which are necessary for serving as a photoreceptor in electrophotography are measured. The result is shown in Table 2.

TABLE 2

| $V_{max}$ | Attenuation of surface potential in darkness | Attenuation of surface potential when illuminated | Residual value of surface potential |
|---|---|---|---|
| Positive charge by corona discharge: +460V | 0.59 | ≈0.2 lux · sec | 0 (V) |
| Negative charge by corona discharge: −610V | 0.61 | ≈0.2 lux · sec | 0 (V) |

The term $V_{max}$ herein used represents the initial surface potential when an a-Si film is charged up in darkness by the use of a corona discharger employing a metal wire having a diameter of 60 micrometers. The term "attenuation of surface potential in darkness" represents the ratio between the surface potential at the end of 3 seconds in darkness and $V_{max}$. The term "attenuation of surface potential when illuminated" represents the length of time multiplied by intensity of illumination, which is required for the surface potential to attenuate up to ½ of the value of the initial surface potential when illuminated by a lighted tungsten lamp at 2800° K. (10 lux at a-Si film surface). Also, the term "residual value of surface potential" represents the surface potential at the end of illumination at ≈5 lux·sec by a fluorescent lamp.

The conditions of measurement in the respective embodiments which will be described hereunder invariably follow the above-mentioned pattern.

As will be understood also from the result shown in Table 2, the a-Si film according to the present invention is highly resistive, and accordingly it is superior in the holding ability of the loaded charge when the film is placed in darkness, and also has a large photoconductivity when illuminated, i.e. it has a high photosensitivity.

EXAMPLE 2

An a-Si film is formed by the use of a plasma CVD system of the type as shown in FIG. 2 comprising a discharging cylindrical electrode having an inner surface area of 2260 cm$^2$ and an aluminum substrate of JIS 3003 serving as an electrode facing thereto and having a diameter of 120 mm$\phi$, a length of 300 mm and a thickness of 5 mm, and these electrodes are housed in a reaction chamber having a volume of about 75 l. The deposition conditions for the formation of the a-Si film are: the temperature of the specimen (substrate) is 200° C., the flow rate of the mixed gas consisting of 10% by volume of SiH$_4$ gas and 90% by volume of H$_2$ gas is 300 ml/min., and the RF power employed is 3 kW. Accordingly, the power density is about 1.3 W/cm$^2$ and the aforesaid ratio F/V is about 0.04 min.$^{-1}$. At the end of 3 hours of glow discharging, the supply of gas is suspended, and the heater intended for controlling the temperature of the substrate is turned off. After evacuating such gas as SiH$_4$, an N$_2$ gas is introduced, and the temperature of the specimen is lowered. When the temperature reached 100° C., the supply of N$_2$ gas is suspended. Then, the reaction chamber is opened to take out therefrom the specimen on which a-Si has deposited. The thickness of the a-Si film thus obtained is 15 micrometers. At the end of 24 hours of keeping the a-Si specimen in darkness, the properties or characteristics of this a-Si film necessary for electrophotography are evaluated. The result is shown in Table 3.

TABLE 3

| $V_{max}$ | Attenuation of surface potential in darkness | Attenuation of surface potential when illuminated | Residual value of surface potential |
|---|---|---|---|
| Positive charge by corona discharge: +520V | 0.60 | 0.15 lux · sec | 0 (V) |
| Negative charge by corona discharge: −600V | 0.60 | 0.15 lux · sec | 0 (V) |

Copying is conducted on a copying machine for test using a negatively charge toner by the use of this photoreceptor. Development is carried out to form a positive image through positive charging of the photoreceptor; and to form a negative image through negarive charging of the photoreceptor, while varying the bias voltage applied for both cases. Both the positive and negative images of the copies taken are noted to be clear.

EXAMPLE 3

Formation of an a-Si film is conducted under the same conditions as for Example 2, excepting that the gases employed in this Example are SiH$_4$+H$_2$ gas and N$_2$ gas, and the flow rate of these gases are:
10% of SiH$_4$ gas and 90% of H$_2$ gas: 3000 ml/min.
100% of N$_2$ gas: 5 ml/min.
The thickness of the a-Si film is 15 micrometers. The characteristic of this a-Si film to serve as a photoreceptor for electrophotography are evaluated. The result is shown in Table 4.

TABLE 4

| $V_{max}$ | Attenuation of surface potential in darkness | Attenuation of surface potential when illuminated |
|---|---|---|
| Positive charge by corona discharge: +680V | 0.63 | 0.2 lux · sec |
| Negative charge by corona discharge: −620V | 0.62 | 0.2 lux · sec |

EXAMPLE 4

As the gas for use in the formation of an a-Si film, a mixed gas of SiH$_4$+H$_2$, N$_2$ and B$_2$H$_6$+H$_2$ is used. The flow rate of these individual gases is:
10% of SiH$_4$ and 90% of H$_2$: 3000 ml/min.
100% of N$_2$: 3 ml/min.
0.1% of B$_2$H$_6$ and 99.9% of H$_2$: 150 ml/min.
The thickness of the a-Si film is 16 micrometers. The characteristics which are necessary for a photoreceptor in electrophotography are evaluated, and the result is shown in Table 5.

TABLE 5

| $V_{max}$ | Attenuation of surface potential in darkness | Attenuation of surface potential when illuminated |
|---|---|---|
| Positive charge by corona discharge: +720V | 0.65 | 0.19 lux · sec |
| Negative charge by corona discharge: −110V | 0.51 | cannot be measured |

The advantages or effects which are obtained from the present invention are enumerated as follows.

(1) A highly resistive a-Si film can be formed.

It should be noted that, even by arranging the amount of the donor impurity which is used for doping is equal to the amount of the acceptor impurity, the resistivity of the a-Si film is noted to be only $10^{11}$–$10^{12}\Omega$-cm at the highest. According to the present invention, in contrast thereto, a resistivity of about $10^{13}\Omega$-cm can be obtained. Although the reason therefor cannot be precisely determined, X-ray diffraction shows that fine single crystals or polycrystalline silicon are present in the diffused state in the a-Si film. Also, the presence of Si-H$_2$ is found through absorption analysis in the infrared region of light. It is considered that these facts lead to a high resistivity.

(2) The a-Si film has a high photosensitivity.

In the conventional method of obtaining a high resistivity by doping O atoms and N atoms by mixing O$_2$ gas or N$_2$ gas into SiH$_4$ gas, no elucidation has been made yet as to the manner in which these O atoms and N atoms are mingled in the a-Si film. It is conjectured, however, that a high resistivity is materialized as a result of formation of such insulators as SiO$_2$ or Si$_3$N$_4$. In this respect, it should be understood that in the a-Si film which is obtained according to the present invention wherein polycrystals and so forth are present in a scattered state, it is easy to control the degree of lowering of the photosensitivity as well as the degree of resistivity of the a-Si film, and thus a photoreceptor having a high photosensitivity can be realized.

(3) Contamination from the system is scarce.

According to the present invention, it should be understood that, in addition to the independent use of SiH$_4$ gas as the reacting gas, a gas containing impurity atoms such as B, P, N and/or O may be mixed with the SiH$_4$ gas. For this reason, in case only SiH$_4$ gas is used to form an a-Si film, it should be understood that, even when silicon which has accumulated within the reaction chamber is beaten by the reacting gas when a high electric power is supplied to the system, there is no fear for a mingling of any impurity into the a-Si film, and thus it is possible to minimize an adverse effect arising from contamination.

(4) Deposition rate is substantial.

It has been usually said that, in order to use an a-Si film in, for example, a solar battery, the application of electric power of a reduced energy for glow discharging brings about a better photoconductivity, and that the deposition rate also is about 1 micrometer or less per hour. According to the present invention, however, it is possible to achieve a deposition rate of 1-10 μm/hr and this is much better from the economical point of view also. In this case, a greater rate of deposition represents an important aspect of the characteristic of the present invention. It should be understood that, by the use of an a-Si film obtained in accordance with the present invention to serve as a photoreceptor of electrophotography, there can be provided a electrophotographic copying machine which is superior in copying function and service life.

In the examples of the present invention, SiH$_4$ gas is used as a reacting gas to obtain an a-Si film. It should be understood, however, that, in place of SiH$_4$ gas, there may be employed, for example, Si$_2$H$_6$ gas. Also, in the examples, there is used B$_2$H$_6$ gas as a p type impurity gas. However, this B$_2$H$_6$ gas may be substituted by other boron hydrides such as B$_4$H$_{10}$. As for an n type impurity gas, such impurity gas is selected from, for example, AsH$_3$ or PH$_3$. Also, in place of doping of N atoms by N$_2$ gas, there may be used NH$_3$ gas.

What is claimed is:

1. A method of forming an amorphous silicon film photosensitive receptor surface adapted for electrophotography, said method comprising the steps of:
    (1) into an evacuated reaction chamber containing a discharge electrode, a substrate onto which said amorphous silicon film is to be deposited facing said discharge electrode, and a second electrode supporting said substrate, a reaction gas containing silicon hydride, introducing a gas into said reaction chamber at a rate such that the ratio (F/V) of the total flow rate (F) in liters per minute of gas introduced relative to the volume in liters (V) of said reaction chamber is at least 0.01 min$^{-1}$; in combination with
    (2) supplying a high frequency power across the facing electrodes in said chamber such that the power density, determined by the ratio of the supplied electric power relative to the discharge electrode's surface area, is at least 0.3 W/cm$^2$, thereby causing decomposition of said reaction gas and deposition of an amorphous silicon film on said substrate by glow discharge.
2. A method according to claim 1, wherein:
said reaction gas is one selected from the group consisting of SiH$_4$, Si$_2$H$_6$, SiH$_4$ plus H$_2$, and Si$_2$H$_6$ plus H$_2$.
3. A method according to claim 2, wherein:
said decomposition of the reaction gas is carried out in the presence of a doping impurity gas.
4. A method according to claim 3, wherein:
said doping impurity gas is selected from the group consisting of B$_2$H$_6$, B$_4$H$_{10}$, AsH$_3$ and PH$_3$.
5. A method according to claim 1, wherein:
said reaction gas is introduced into said reaction chamber along with a gas selected from the group consisting of N$_2$, NH$_3$ and O$_2$.
6. A method according to claim 1, wherein:
said high frequency is a radio frequency.

* * * * *